(12) United States Patent
Schaefer et al.

(10) Patent No.: US 10,366,734 B2
(45) Date of Patent: Jul. 30, 2019

(54) PROGRAMMABLE WRITE WORD LINE BOOST FOR LOW VOLTAGE MEMORY OPERATION

(71) Applicant: Advanced Micro Devices, Inc., Sunnyvale, CA (US)

(72) Inventors: Alexander W. Schaefer, Austin, TX (US); Ravi T. Jotwani, Austin, TX (US); Samiul Haque Khan, Austin, TX (US); David Hugh McIntyre, Sunnyvale, CA (US); Stephen Victor Kosonocky, Ft. Collins, CO (US); John J. Wuu, Fort Collins, CO (US); Russell Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/424,418

(22) Filed: Feb. 3, 2017

(65) Prior Publication Data

US 2018/0226111 A1 Aug. 9, 2018

(51) Int. Cl.
*G11C 8/08* (2006.01)
*G11C 11/418* (2006.01)
*G11C 5/14* (2006.01)
*G11C 11/413* (2006.01)
*G11C 11/419* (2006.01)

(52) U.S. Cl.
CPC .............. *G11C 8/08* (2013.01); *G11C 5/145* (2013.01); *G11C 11/413* (2013.01); *G11C 11/418* (2013.01); *G11C 11/419* (2013.01)

(58) Field of Classification Search
CPC ....... G11C 8/08; G06F 3/0658; G06F 3/0622; G06F 3/0673
See application file for complete search history.

(56) References Cited

U.S. PATENT DOCUMENTS

| 5,764,529 A | 6/1998 | Capps et al. |
| 6,414,862 B1 * | 7/2002 | Ogura ................ G11C 5/143 363/60 |
| 8,463,973 B2 | 6/2013 | Naffziger et al. |
| 2001/0045815 A1 | 11/2001 | Muratov et al. |

(Continued)

FOREIGN PATENT DOCUMENTS

WO 9814950 A1 4/1998

*Primary Examiner* — Mohammed A Bashar
(74) *Attorney, Agent, or Firm* — Meyertons Hood Kivlin Kowert and Goetzel PC; Rory D. Rankin

(57) ABSTRACT

A system and method for efficient power, performance and stability tradeoffs of memory accesses under a variety of conditions are described. A system management unit in a computing system interfaces with a memory and a processing unit, and uses boosting of word line voltage levels in the memory to assist write operations. The computing system supports selecting one of multiple word line boost values, each with an associated cross-over region. A cross-over region is a range of operating voltages for the memory used for determining whether to enable or disable boosting of word line voltage levels in the memory. The system management unit selects between enabling and disabling the boosting of word line voltage levels based on a target operational voltage for the memory and the cross-over region prior to updating the operating parameters of the memory to include the target operational voltage.

20 Claims, 8 Drawing Sheets

(56) References Cited

U.S. PATENT DOCUMENTS

| | | |
|---|---|---|
| 2002/0087896 A1 | 7/2002 | Cline et al. |
| 2002/0138778 A1 | 9/2002 | Cole |
| 2003/0021152 A1* | 1/2003 | Le .......................... G11C 8/08 365/185.18 |
| 2003/0065960 A1 | 4/2003 | Rusu |
| 2004/0003301 A1 | 1/2004 | Nguyen |
| 2004/0125514 A1 | 7/2004 | Gunther et al. |
| 2004/0236972 A1 | 11/2004 | Brown et al. |
| 2006/0047986 A1 | 3/2006 | Kurts et al. |
| 2008/0104423 A1 | 5/2008 | Boecker et al. |
| 2008/0201591 A1 | 8/2008 | Hu et al. |
| 2009/0116305 A1* | 5/2009 | Son .......................... G11C 8/08 365/189.09 |
| 2009/0167270 A1 | 7/2009 | Lam et al. |
| 2009/0167282 A1 | 7/2009 | Koertzen et al. |
| 2009/0313485 A1 | 12/2009 | Huang |
| 2010/0083009 A1 | 4/2010 | Rotem et al. |
| 2011/0154066 A1 | 6/2011 | Ravichandran et al. |
| 2011/0191602 A1 | 8/2011 | Bearden et al. |
| 2012/0069682 A1* | 3/2012 | Joo ........................ G11C 16/08 365/185.25 |

* cited by examiner

PROGRAMMABLE WRITE WORD LINE BOOST FOR LOW VOLTAGE MEMORY OPERATION

BACKGROUND

Description of the Relevant Art

Both planar transistors (devices) and non-planar transistors are fabricated for use in integrated circuits within semiconductor chips. Advances in semiconductor fabrication techniques have been reducing transistor dimensions in order to increase both performance and functionality within the same amount of space. The supply voltages for the integrated circuits have been scaling down to reduce both power consumption and short channel effects. Further, many of the integrated circuits are used in a variety of products such as portable computers, mobile communication devices, and high-performance desktop computers and servers. System management units are used to provide multiple operating modes for scaling both the operating frequency and power supply of the integrated circuits in an effort to trade off performance and low power dissipation.

The semiconductor chips include at least one processing unit coupled to a memory. The processing unit processes instructions by fetching instructions and data, decoding instructions, executing instructions, and storing results. The processing unit sends memory access requests to the memory for both fetching instructions and data and storing results of computations. Arrays within the memory are capable of consuming an appreciable amount of space. Both static random access memory (SRAM) and dynamic random access memory (DRAM) use memory arrays.

The memory array uses many bit cells while a logic portion is used for accessing values stored in the array. Write and read word lines are asserted and deasserted by the logic portion for accessing the memory array. The write and read word lines of memory arrays can be heavily loaded while the line resistance is high due to narrow line dimensions. In order to balance performance, power consumption, and bit cell stability of the memory arrays, multiple design techniques, such as the above techniques, are used. However, the tradeoffs of the above techniques combined with the multiple different process, voltage, and temperature conditions for the semiconductor chip can limit flexibility and leave one or more design goals unsatisfied.

In view of the above, efficient methods and systems for providing efficient power, performance and stability tradeoffs of memory accesses under a variety of conditions are desired.

Figure 1:
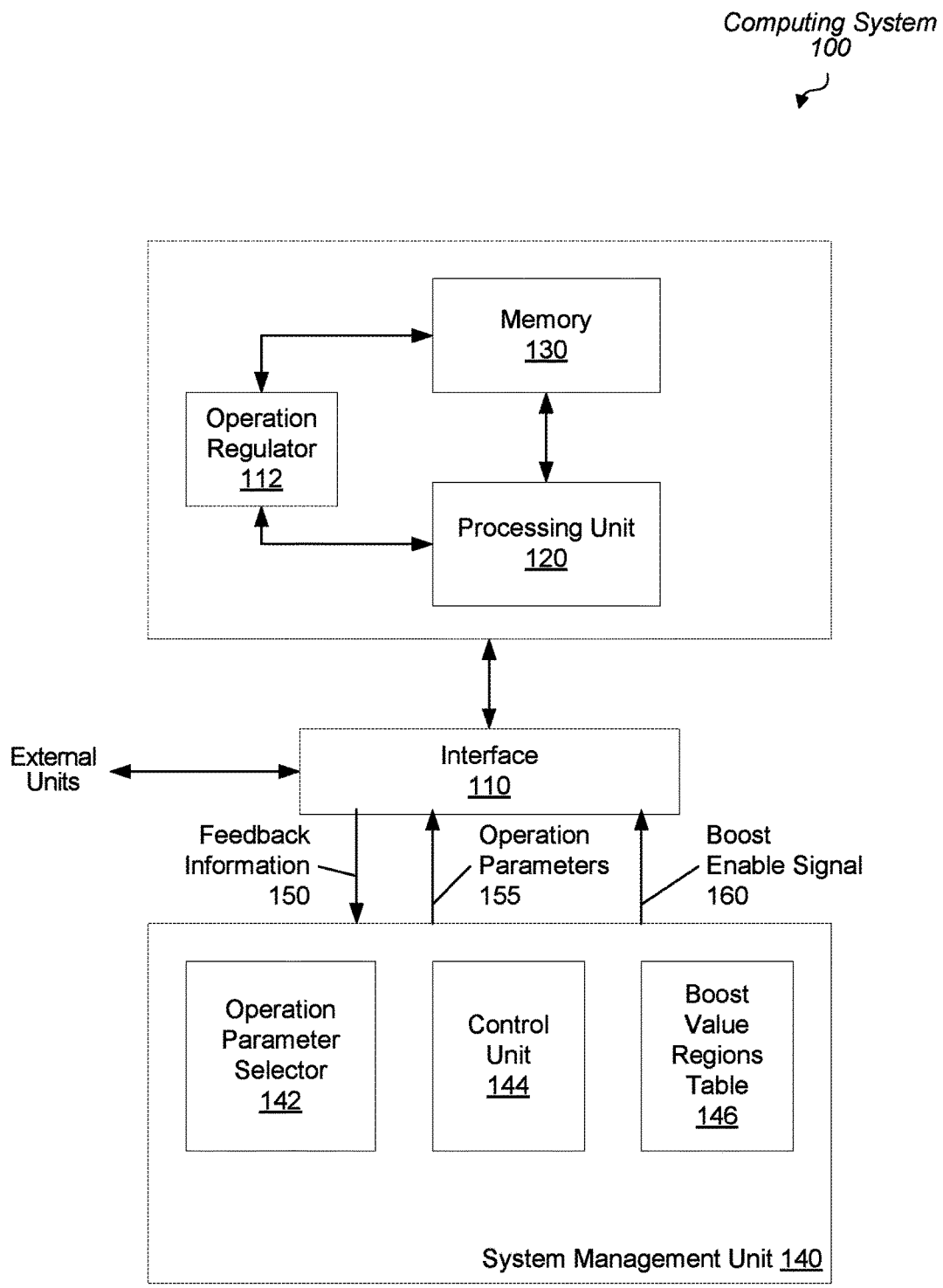
FIG. 1 is a generalized diagram of one embodiment of a computing system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for providing efficient power, performance and stability tradeoffs of memory accesses under a variety of conditions are contemplated. A system management unit in a computing system interfaces with a memory and a processing unit. The memory operates with operating parameters which include at least an initial operating voltage. The processing unit generates access requests for the memory. During operation, the system management unit combats memory access failures by boosting word line voltage levels in the memory. The memory access failures include unstable write operation failures, unstable read operation failures and access time failures.

In contrast to enabling or disabling the boosting of word line voltage levels in the memory based on a current operating voltage for the memory, the system management unit selects between enabling and disabling the boosting of word line voltage levels based at least in part on an upcoming target operational voltage for the memory prior to updating the operating parameters of the memory to include the target operational voltage. As used herein, "boosting" the word line voltage level means increasing the word line voltage level. The system management unit determines the target operational voltage, which is different than the initial operating voltage currently used by the memory. In some embodiments, the target operational voltage is based on feedback information received from one or more of the processing unit and the memory. The feedback information includes one or more of monitored usage information and on-die sensor values.

The system management unit additionally sets a crossover region which is a range of operating voltages for the memory used for determining whether to enable or disable boosting of word line voltage levels in the memory. The range is a subset of operating voltages below a maximum rated operating voltage of the memory and above a minimum rated operating voltage of the memory. The range includes an upper limit and a lower limit. In one example, a semiconductor chip in the computing system uses 1.2 volts (V) and 0.6V as the maximum and minimum operating voltages, whereas the system management unit sets the cross-over region to include an upper limit of 0.95V and a lower limit of 0.8V. The cross-over region is based on the word line boost value currently being used. In one example, the currently used word line boost value is 0.2V. For another word line boost value, such as 0.1V, the cross-over region includes a different operating voltage range. In some embodiments, the system management unit supports multiple available word line boost values, each with an associated cross-over region.

In various embodiments, when an operating voltage of the memory reaches or exceeds an upper limit of the cross-over region (e.g., 0.95V or some other value), the system management unit disables boosting of word line voltage levels in the memory. The upper limit that is used to disable boosting of word line voltage levels is selected in order to prevent the word line voltage levels (VDD+boost amount) from exceeding a specified operating voltage (e.g., a maximum rated operating voltage) that may cause transistor damage. Such damage may be due to one or more of time-dependent dielectric breakdown (TDDB), negative-bias temperature instability (NBTI), and positive-bias temperature instability (PBTI). In some embodiments, the maximum rated operating voltage (e.g., 1.2V) is determined based on the thermal design power (TDP) of a semiconductor chip. In such cases, it is determined that the semiconductor chip is able to safely operate at the TDP level without causing transistor damage.

In various embodiments, when the memory operates with an operating voltage below the lower limit (e.g., 0.8V) of the cross-over region, the system management unit enables boosting of word line voltage levels in the memory to strengthen the pass gates used during write operations. In some embodiments, a write operation in the memory becomes unpredictable in completing when the word line voltage level falls below the minimum operating voltage (e.g., 0.6V). In some embodiments, at least voltage droop during system operation causes the word line voltage level to fall below the minimum operating voltage and increase the probability for write operation instability and/or access time failure.

In some embodiments, when the system management unit determines the target operational voltage for the memory is within the cross-over region (e.g., 0.8V to 0.95V), the system management unit selects between enabling and disabling boosting of word line voltage levels in the memory based at least in part on the previous operating voltage. In one embodiment, the memory uses an operating voltage of 1.1V, which is above the upper limit of the cross-over region, and accordingly, boosting of the word line voltage level is disabled. The system management unit determines the target operational voltage is 0.85V. The system management unit maintains the current state of enabling or disabling the boosting of the word line voltage level for when the memory uses the target operational voltage of 0.85V. In this case, the system management unit generates control signals indicating to continue disabling the boosting of the word line voltage level for when the memory uses the target operational voltage of 0.85V.

In another embodiment, the memory uses an operating voltage of 0.7V, which is below the lower limit of the cross-over region, and accordingly, boosting of the word line voltage level is enabled. Again, the system management unit determines the target operational voltage is 0.85V. The system management unit maintains the current state of enabling or disabling the boosting of the word line voltage level for when the memory uses the target operational voltage of 0.85V. In this case, the system management unit provides control signals indicating to continue enabling the boosting of the word line voltage level for when the memory uses the target operational voltage of 0.85V. Therefore, the value of the voltage level within the cross-over region alone is not enough to determine whether to enable or disable boosting of the word line voltage level for when the memory.

In various embodiments, the system management unit determines the cross-over region is between an initial operating voltage used by the memory and the target operational voltage. In response, the system management unit updates the operating parameters to include an intermediate operating voltage for the memory within the cross-over region. The system management unit enables boosting of word line voltage levels in the memory when it determines the initial operating voltage is greater than the target operational voltage. For example, when the memory uses an initial operating voltage of 1.1V and the target operational voltage is 0.6V, the system management unit generates control signals indicating the memory transitions to using an operating voltage of 0.9V, which is within the example cross-over region between 0.8V and 0.95V, and boosting of the word line voltage levels transitions from being disabled to being enabled. Afterward, the system management unit generates controls signals indicating the memory transitions to using the target operational voltage of 0.6V.

In a similar example, when the memory uses an initial operating voltage of 0.65V and the target operational voltage is 1.1V, the system management unit generates control signals indicating the memory transitions to using an operating voltage of 0.9V, which is within the example cross-over region between 0.8V and 0.95V, and boosting of the word line voltage levels transitions from being enabled to being disabled. Afterward, the system management unit generates controls signals indicating the memory transitions to using the target operational voltage of 1.1V.

Turning now to FIG. 1, one embodiment of a computing system 100 is shown. As shown, the computing system 100 includes a processing unit 120, a memory 130, an interface 110, an operation regulator 112 and a system management unit 140. In some embodiments, the functionality of the computing system 100 is included as components on a single die, such as a single integrated circuit. In other embodiments, the functionality of the computing system 100 is included as multiple dies on a system-on-a-chip (SOC). In various embodiments, the computing system 100 is used in a desktop, a portable computer, a mobile device, a server, a peripheral device, or otherwise.

The components of the computing system 100 are capable of using both planar devices (transistors) and non-planar devices. In various embodiments, the interface 110 is used to communicate with other components such as a memory controller, a network interface card (NIC), peripheral devices, and so forth, which are not shown for ease of illustration. The interface unit 110 is also used to transfer messages, data and control signals between the system management unit 140 and each of the processing unit 120 and the memory 130. The control logic in the interface 110 operates according to communication protocols corresponding to each unit transferring information with it.

The processing unit 120 processes instructions of a predetermined algorithm. The processing includes fetching instructions and data, decoding instructions, executing instructions and storing results. In some embodiments, the processing unit 120 is a general-purpose microprocessor. In other embodiments, the processing unit 120 is an application specific integrated circuit (ASIC). In yet other embodiments, the processing unit is a single-instruction-multiple-data (SIMD) microarchitecture processor. In still further embodiments, the processing unit 120 includes the functionality of two or more different architectures such as a general-purpose central processing unit (CPU) and a SIMD processor such as a graphics processing unit (GPU). While processing instructions, the processing unit 120 performs calculations and generates memory access requests for retrieving instructions and operand data and for storing result data.

In various embodiments, memory 130 represents an entirety of a memory system, a portion of a memory system, is at least a portion of a cache hierarchy, comprises a random access memory, or otherwise. These and other embodiments are possible and are contemplated. In yet other embodiments, the memory 130 is a structure embedded within the processing unit 120. For example, the memory 130 may be a patch RAM, a branch instruction prediction table, any of a variety of internal caches (e.g., a translation lookaside buffer, an on-die data or instruction cache), and so on. In various embodiments, the memory 130 includes access control logic and an array of memory macro cells arranged in rows and columns. Each of the memory macro cells includes a latching element and a precharging portion for driving values on differential bit lines. The memory 130 is accessed for the fetching operations and the generated memory access requests, which include storing results. Although a single memory is shown, in various embodiments, multiple memories are used in the computing system 100.

In various embodiments, one or more of the processing unit 120 and the memory 130 receives operating parameters from the operation regulator 112 for operating both logic and circuitry. The operating parameters include at least a combination of an operational frequency and an operational voltage. In some embodiments, one or more of the processing unit 120 and the memory 130 sends feedback information 150 to the operation parameter selector 142 within the system management unit 140. Based on at least the feedback information 150, the operation parameter selector 142 generates control signals and values indicating the operating parameters 155 to be supplied by the operation regulator 112 to the processing unit 120 and the memory 130. Although a single operation regulator 112 is shown, in some embodiments, each of the processing unit 120 and the memory 130 is coupled to a separate and respective operational regulator.

In some embodiments, a power target, such as the thermal design power (TDP), is assigned to the combination of the processing unit 120 and the memory 130. For example, such a TDP may be established based on a determination that the cooling system is able to dissipate the TDP value without exceeding the maximum junction temperature for transistors. In some embodiments, the system management unit 140 associates a total number of power credits with the TDP value and allocates a separate number of power credits to each of the processing unit 120 and the memory 130. A sum of the power credits allocated to the various units generally equals the total number of power credits. Although embodiments where the sum may temporarily exceed the TDP are possible and are contemplated. In various embodiments, the system management unit 140 adjusts the number of power credits for each of the processing unit 120 and the memory 130 based on the received feedback information 150. Examples of the feedback information 150 are monitored usage information of the processing unit 120 and the memory 130 in addition to on-die sensor values. In some embodiments, the monitored usage information includes one or more of the power credits, weighted activity levels, weighted usage of pre-selected signals, and digital temperature or power calculated values. In some embodiments, one or more of the other examples of the feedback information 150 are converted to power credits within the system management unit 140.

Examples of the on-die sensor values are on-die temperature readings and on-die drawn current readings. In some embodiments, the operation parameter selector 142 receives the feedback information 150 with a known frequency. For example, information is sampled and sensed, calculations are performed and the results are sent to the operation parameter selector 142 during a given time interval. The determination of the time interval is based on a combination of the desired accuracy and confidence of the feedback information 150, and desired results from updated operating parameters 155 found from analysis including simulations and/or executions during production.

In some embodiments, the operation parameter selector 142 determines a combination of operational voltage and clock frequency for the processing unit 120 and the memory 130. In some embodiments, each of the processing unit 120 and the memory 130 use a separate combination of operational voltage and clock frequency. In other embodiments, each of the processing unit 120 and the memory 130 uses a same combination of operational voltage and clock frequency. The combination of operational voltage and clock frequency is referred to as a power-performance state (P-state).

While running one or more software applications, the real-time feedback information 150 is conveyed to the operation parameter selector 142, which balances reduced power consumption and increased performance for the computing system 100. In one embodiment, the operation parameter selector 142 selects one discrete power-performance state (P-state) from several given discrete P-states.

The P-state selected by the operation parameter selector 142 is between a maximum performance state and a minimum power state. The maximum performance state includes a maximum operating clock frequency and a maximum operational voltage, whereas the minimum power state includes a minimum operating clock frequency and a minimum operational voltage. The intermediate discrete power-performance states (P-states) include given scaled values for a combination of the operating frequency and the operational voltage. Each of the discrete P-states is associated with an operating mode. The operating mode is selected by the operation parameter selector 142 using design limits set by at least a thermal design power (TDP) and prevention of memory access failures.

The thermal design power (TDP) represents a maximum amount of power a semiconductor chip is able to consume while maintaining safe operation. The semiconductor chip is able to dissipate the TDP value without exceeding the maximum junction temperature for transistors within the semiconductor chip. To prevent failure, the semiconductor chip operates within the TDP value.

As the operational voltage decreases for the memory 130, write operation instability and access time increase. Variations in semiconductor device fabrication processes contribute to the memory access failures. In addition, the declining strength of the transistors with shrinking dimensions also contribute to the memory access failures. In some embodiments, at least the TDP is used to set the maximum rated operating voltage of the memory 130, whereas preventing memory access failures is used to set the minimum rated operating voltage of the memory 130.

To balance using a low power operating mode and preventing memory access failures, the control unit 144 within the system management unit 140 enables boosting of the word line voltage levels in the memory 130. An indication of whether to use boosting is provided on the boost enable signal 160. In some embodiments, at least voltage droop during operation of the computing system 100 causes the word line voltage level of the memory 130 to fall below the minimum operating voltage and increase the probability for write operation instability and/or access time failure. Circuit techniques are used to provide boosting of the word line voltage levels in the memory 130 in order to prevent memory access failure.

While the memory 130 uses a current operational voltage, the control unit 144 uses a cross-over region for determining whether to enable or disable boosting of word line voltage levels in the memory 130. The cross-over region is a range of operational voltages between an upper limit and a lower limit. The upper limit of the cross-over range is a maximum operating voltage used by the memory 130 with enabled boosting of the word line voltage levels in the memory 130 prior to disabling boosting. In various embodiments, the boosting of the word line voltage levels in the memory 130 is disabled for operational voltages above the upper limit (e.g., 0.95V) so as to prevent the memory word line voltage levels from exceeding the maximum rated operating voltage (e.g., 1.2V) of the memory 130.

The lower limit of the cross-over range is a minimum operating voltage used by the memory 130 with disabled boosting of the word line voltage levels in the memory 130 prior to enabling boosting. In various embodiments, the boosting of the word line voltage levels in the memory 130 is enabled for operational voltages below the lower limit (e.g., 0.8V) so as to prevent the memory word line voltage levels from falling below the minimum rated operating voltage (e.g., 0.6V) of the memory 130.

The cross-over region is based on a currently used word line boost value (e.g., 0.2V). In some embodiments, the system management unit 140 supports multiple available word line boost values, each with an associated cross-over region. In such embodiments, the table 146 stores the upper limit and lower limit pairs of the multiple cross-over regions and the associated word line boost values. Any of a variety of data structures is used to store the limits and indications of the associated word line boost values in the table 146. In some embodiments, the table 146 is programmable.

The control unit 144 receives target operation parameters from the operation parameter selector 142. The control unit 144 accesses the table 146 to obtain the current cross-over region based on the currently used word line boost value. The control unit 144 possibly adjusts the target operation parameters before sending the operating parameters 155 to the operating regulator 112. The control unit 144 also generates the boost enable signal 160.

When generating the boost enable signal 160, the control unit 144 selects between enabling and disabling boosting of word line voltage levels in the memory 130 based on the target operational voltage for the memory 130 and the cross-over region prior to updating the operating parameters 155 to include the target operational voltage. Before further describing the steps of updating the operating parameters 155 and generating the boost enable signal 160, a description of the memory macro cells is given.

Figure 2:
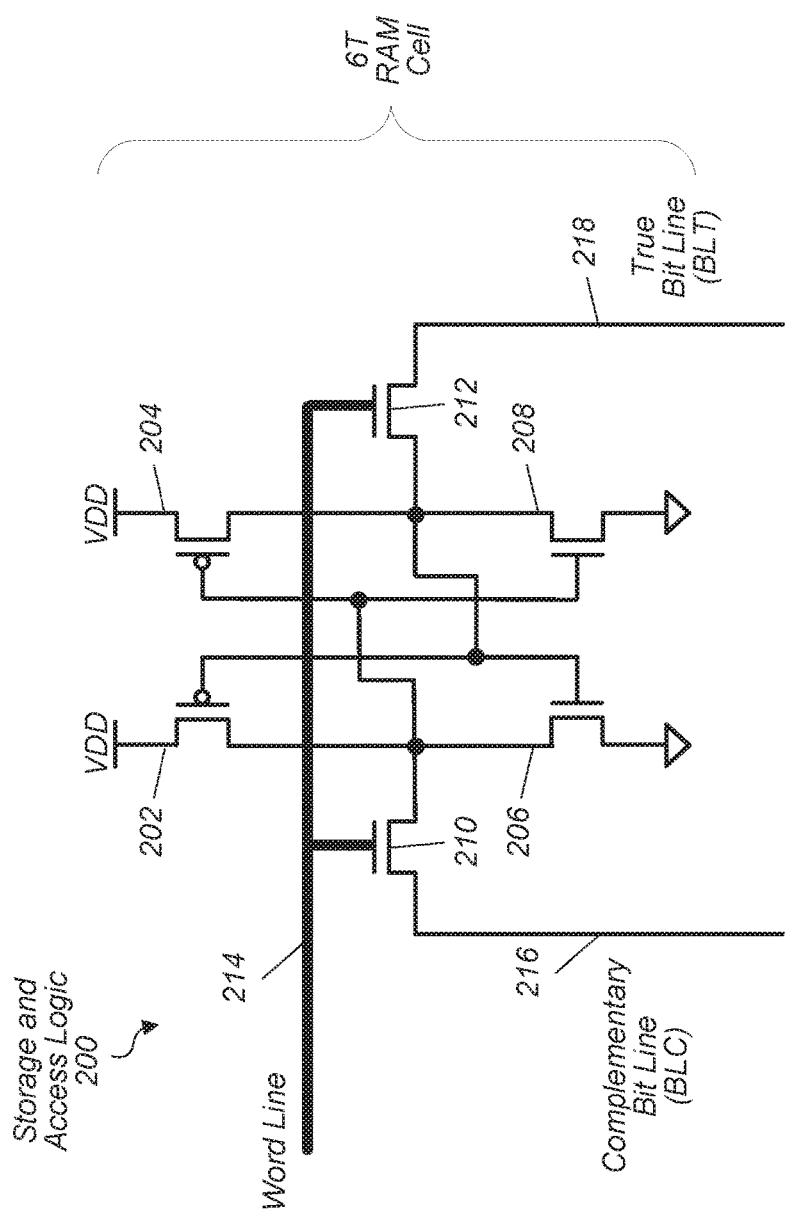
FIG. 2 is a generalized diagram of one embodiment of a memory macro cell.
Figure 3:
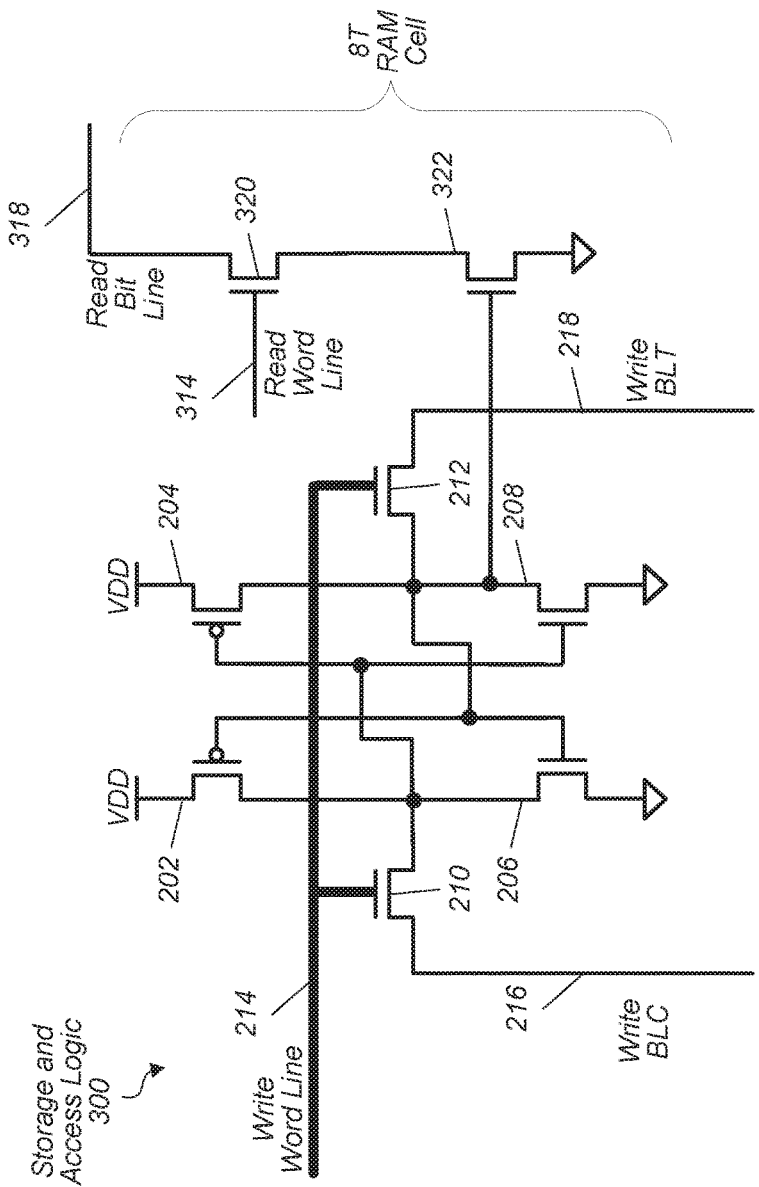
FIG. 3 is a generalized diagram of another embodiment of a memory macro cell.

Each of FIGS. 2-3 illustrate embodiments of a memory macro cell. Although two examples of memory macro cells are shown, any variation of a random access memory (RAM) macro cell is selected based on design needs. Turning now to FIG. 2, one embodiment of a memory macro cell 200 used for storing data and providing access to the data is shown. In the embodiment shown, data storage uses a variation of the six-transistor (6T) RAM cell. In various embodiments, the macro cell 200 is copied many times and arranged in an array of rows and columns for a memory. In various embodiments, the memory includes external logic (not shown) such as row decoders, column decoders and a sense amplifier. Although the macro cell 200 is shown as a single ported memory macro cell, in other embodiments, the macro cell 200 uses a multi-port design to provide parallel access operations for improved performance.

The macro cell 200 utilizes pmos transistors 202-204 and NMOS transistors 206-208 as a latching element. When the NMOS transistors 210 and 212 are enabled by the word line input 214, the latching element has access to the bit lines 216 and 218. When the transistors 202-208 of the latching element resolve the voltage level (data value) on the output nodes, which are drain terminals, the transistors 202-208 do not consume power besides leakage current power.

The data stored by the transistors 202-208 of the latching element is gated from the bit lines 216 and 218 by the NMOS transistors 210 and 212. The NMOS transistors 210 and 212 continue to block the stored data from the bit lines 216 and 218 until the word line input 214 is enabled by external access logic. The bit lines 216 and 218 are precharged by external circuitry.

The transistors 202-208 of the latching element amplify any voltage difference detected between the differential voltages on the bit lines 216 and 218 and resolve these voltages to full swing voltage values. The bit lines 216 and 218 are routed throughout a respective column of the array. In some embodiments, the bit lines 216 and 218 are also inputs to a sense amplifier (not shown) and read latches (not shown). In other embodiments, the bit lines 216 and 218 are inputs to dynamic logic.

The word line 214 is used to enable the NMOS transistors 210 and 212. The word line 214 is also connected to other 6T RAM cells of other macro cells in a corresponding row of the array. A row decoder (not shown) receives address information and enables a single row word line of many row word lines. When the address information indicates the word line 214 is to be enabled, the NMOS transistors 210 and 212 of each 6T RAM cell in the row are enabled and provide access for the transistors 202-208 of the latching element to the bit lines 216 and 218.

For read access operations, the external sense amplifier is enabled, the external read latches are enabled, and external precharge transistors are disabled. Therefore, the transistors 202-208 of the latching element are permitted to resolve the differential voltages on the bit lines 216 and 218 to full voltage swing values. For write access operations, a column decoder and write logic (not shown) select columns of the array and drive voltage values onto the bit lines 216 and 218 routed throughout a selected column in addition to disabling external precharge signals.

The transistors 202-208 of the latching element use the power supply designated as "VDD." In addition, the word line 214 is driven by the power supply VDD. As described earlier, the system management unit determines the value of VDD while transitioning the memory between different operating modes. In some embodiments, each operating mode is associated with one or more P-states.

As described earlier, the word line 214 is also connected to other 6T RAM cells of other macro cells in a corresponding row of the array. These other connections cause the word line 214 to be heavily loaded while the line resistance is high due to relatively narrow line dimensions. Further, the word line 214 as well as the relatively small transistors 202-212 are susceptible to process variations during semiconductor device fabrication. As the geometric dimensions decrease, the clock period decreases and the power supply VDD decreases, the probability that the macro cell 200 experiences memory access failures increase. For example, a write operation does not complete as the word line 214 has a sufficiently low voltage level to prevent the write operation from completing. Alternatively, the write operation eventually completes but the latency is sufficient to cause the clock frequency to be below the minimum clock frequency for the chip. To prevent memory access failures of the memory macro cell 200, the word line 214 is boosted by increasing the power supply voltage to the corresponding word line driver (not shown).

Referring now to FIG. 3, another embodiment of a memory macro cell 300 used for storing data and providing access to the data is shown. The transistors 202-212 and the lines 214-218 are the same transistors and lines described earlier and accordingly are numbered identically. The read and write operations are separated by adding the stack of NMOS transistors 320 and 322. The 8T memory macro cell 300 has an on-die area penalty over the previous 6T memory macro cell 200 described earlier due to the transistors 320 and 322 and the extra routes for the read word line 314 and the read bit line 318. However, the 8T memory macro cell 300 operates with higher stability at lower power supply values in comparison with the 6T memory macro cell 200.

The stability of the memory macro cell 300 is improved over the earlier memory macro cell 200 by isolating the current drawn by a read operation from a data storage node among the transistors 202-208 of the latching element. The read and write operations are controlled by the separate write word line 214 and read word line 314. As described earlier, although two examples of memory macro cells are shown in FIGS. 2-3, any variation of a random access memory (RAM) macro cell is selected based on design needs. In other memory macro cell designs, one or more of the number of bit lines, the number of word lines and the number of transistors is modified.

Figure 4:
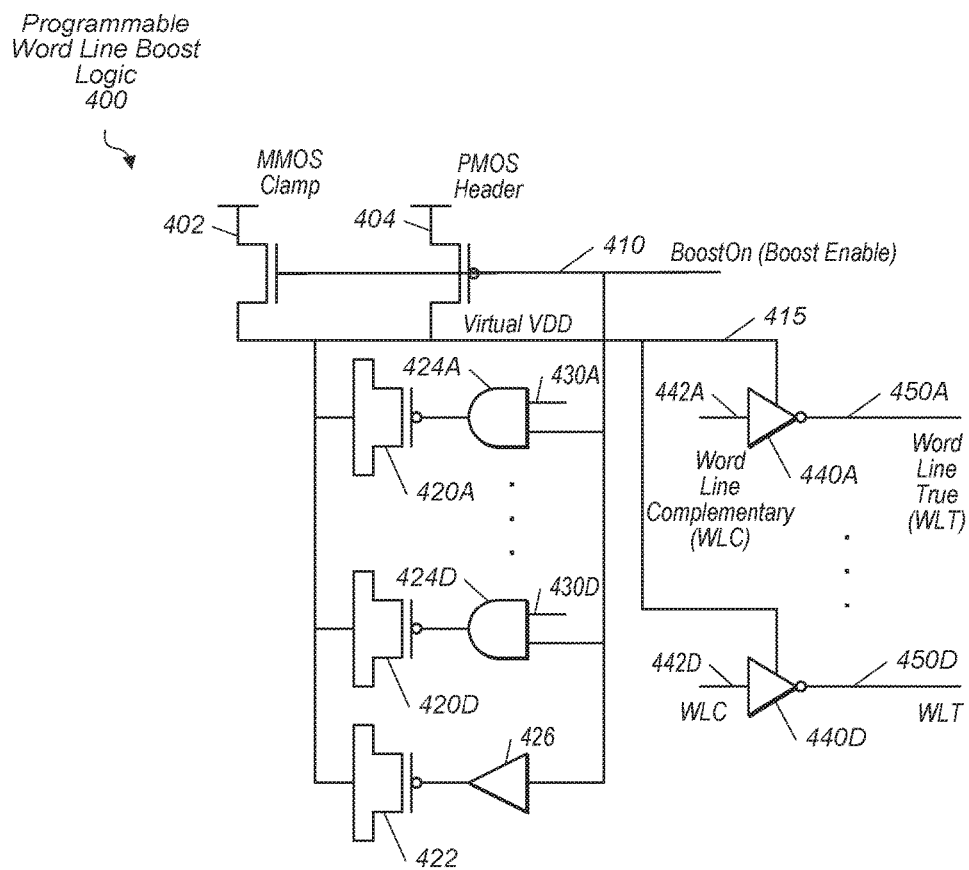
FIG. 4 is a generalized diagram of one embodiment of a programmable word line boost logic.

Turning now to FIG. 4, one embodiment of programmable word line boost logic 400 is shown. The programmable word line boost logic 400 increases the voltage level generated by a selected one of the word line drivers 440A-440D. The boosted voltage level of the selected one of the word lines 450A-450D is sent to pass gates within multiple instantiations of memory macro cells in the selected row of the memory array. As descried earlier, examples of the pass gates and the routing of word lines within memory macro cells are shown in FIGS. 2-3. The selected one of the word lines 450A-450D sends a voltage level that is a sum of the power supply VDD and an amount of programmable boost.

Each one of the transistors 420A-420D and 422 is capable of providing a boost capacitance which increases the voltage level of the virtual VDD line 415 to a sum of the power supply VDD and an amount of programmable boost. The transistors 420A-420D and 422 receive enable signals on their gate inputs from the logic gates 424A-424D and 426. As shown, the AND logic gates 424A-424D receive inputs 430A-430D, which are programmable inputs. The inputs 430A-430D are used to adjust the word line boost value. Based on the capacitance provided by the enabled transistors of the transistors 420A-420D and 422, the amount of a boosted voltage level added to the virtual VDD on line 415 is determined. In other embodiments, rather than the transistor capacitance of the transistors 420A-420D and 422 being used to provide the capacitance for adjusting the boosted voltage level, metal caps or other techniques may be used. In some embodiments, the transistor 422 is conditionally enabled by the buffer gate 426, which receives the control input BoostOn provided on the line 410. Each of the transistors 420A-420D is controlled by the input BoostOn provided on the line 410 and additionally controlled by a corresponding one of the inputs 430A-430D.

The programmable values on the inputs 430A-430D are used to determine the word line boost value on the virtual VDD line 415 and a selected one of word lines 450A-450D. In some embodiments, the system management unit determines the values provided on the 430A-430D. In some embodiments, configuration and status registers store values to be conveyed on the inputs 430A-430D. These registers are capable of being loaded with new values over time. In other embodiments, multiple sets of values are stored or set as permanent values such as being tied to the power supply or to the ground plane. Selection logic, such as a multiplexer, is used to choose which value to use during a given time interval. In other embodiments, the inputs 430A-430D can be controlled by boundary scan (e.g., JTAG), scan chains, or fuses.

A row decoder (not shown) receives address information and enables a single row word line of many row word lines via one of the inputs 442A-442D. The corresponding one of the word line drivers 440A-440D conveys the boosted word line on an associated one of the word lines 450A-450D. The BoostOn signal on line 410 is an enable signal indicating word line boosting is enable. As the BoostOn signal on line 410 becomes asserted to a logic high value, the drain-to-source path through the pmos transistor 404 becomes non-conductive. In contrast, the source-to-drain path through the NMOS transistor 402 becomes conductive. The boost capacitance from one or more of the transistors 420A-420D and 422 accumulates charge to generate the boosted virtual VDD on line 415. The clamping NMOS transistor 402 restricts the virtual VDD on line 415 from dropping below a lower limit when operating at a relatively low frequency. In various embodiments, the lower limit is one threshold voltage with body effect less than the supply voltage VDD (i.e., supply voltage VDD—threshold voltage). To prevent the virtual VDD on line 415 from rising above an upper limit, the pmos transistors in the inverters 442A-442D provide a built-in clamping mechanism. In various embodiments, the upper limit is the sum of the supply voltage VDD and the threshold voltage.

Figure 5:
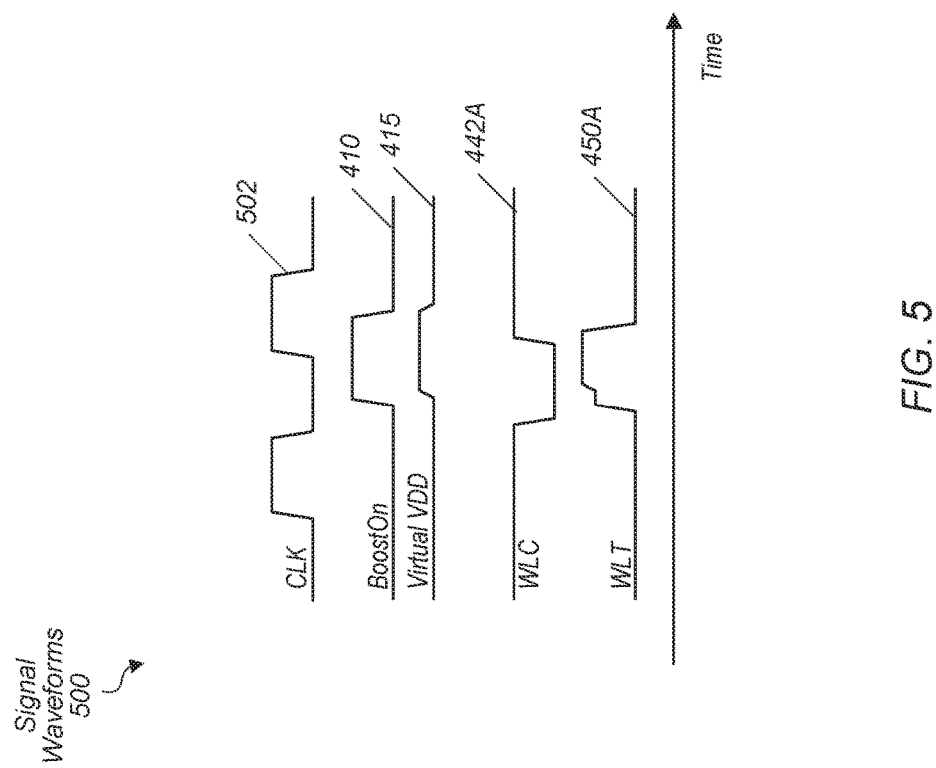
FIG. 5 is a generalized diagram of one embodiment of signal waveforms.

Turning now to FIG. 5, one embodiment of signal waveforms 500 is shown. Signals described earlier are numbered identically. As shown, during each clock cycle of the clock waveform 502, the control signal BoostOn on line 410 is either asserted or not. In various embodiments, the system management unit determines when to enable the BoostOn signal on line 410. The signal 415 corresponding to the virtual VDD is boosted to a higher value than VDD by a word line boost amount when the BoostOn signal is asserted. As a result, the word line true (WLT) outputs from the word line drivers are driven with a boosted voltage level. As shown, the word line on line 450A of the word lines 450A-450D is boosted when the BoostOn signal on line 410 is asserted. The amount of boosting is programmable and set by the one or more inputs sent to the programmable word line boost logic.

Figure 6:
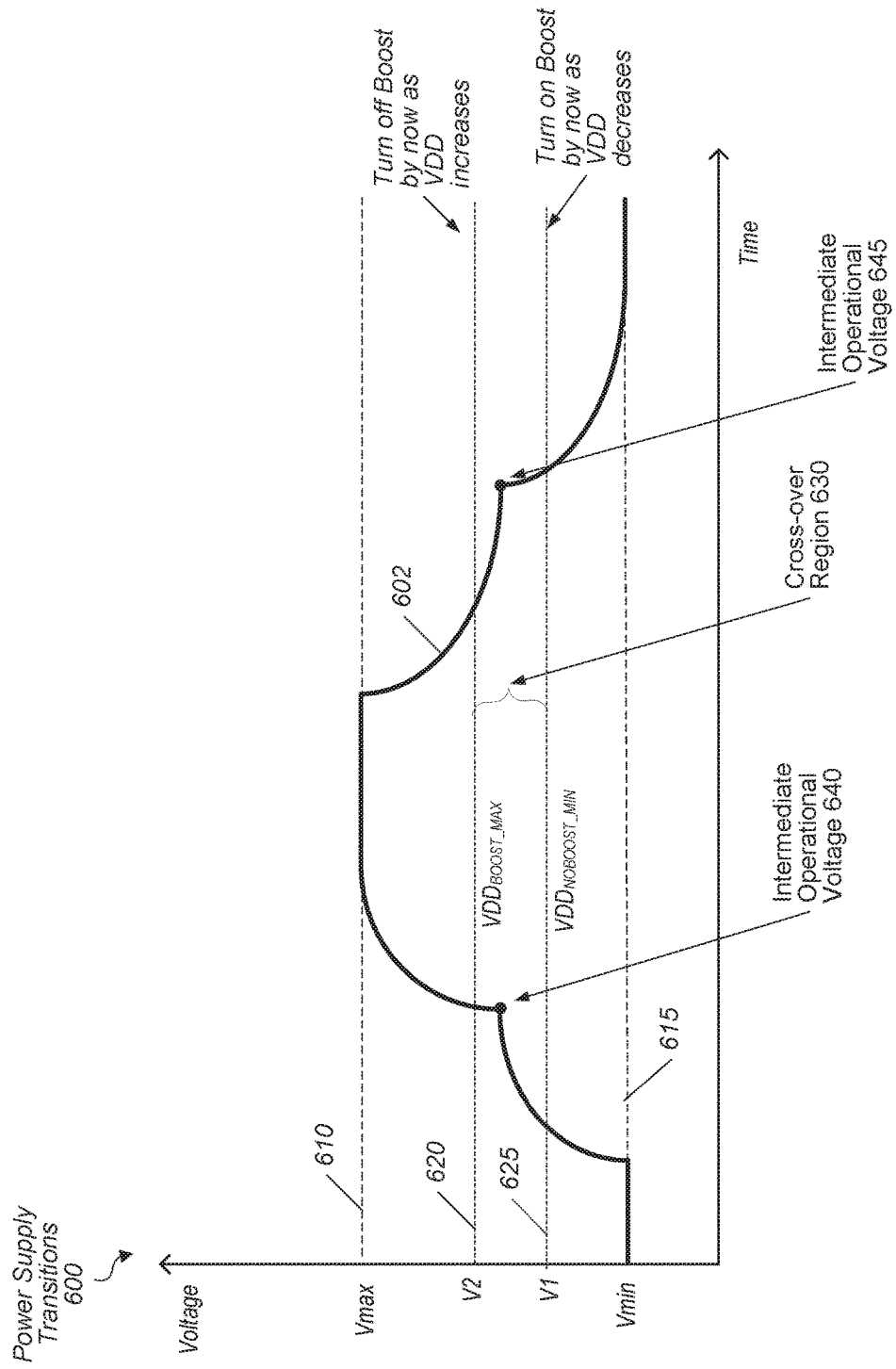
FIG. 6 is a generalized diagram of one embodiment of power supply transitions.

Referring now to FIG. 6, one embodiment of power supply transitions 600 with boosting is shown. As shown, the power supply for a memory indicated as VDD 602 for has a maximum rated operating voltage indicated by "Vmax" 610 for a memory and additionally a minimum rated operating voltage indicated by "Vmin" 615. The determination of these values are performed as described earlier regarding at least the TDP for the chip and the prevention of memory access failures. In various embodiments, the transitioning of the memory VDD 602 is determined by the system management unit. In some embodiments, the transitioning is based on varying operating modes of the memory. For example, in one embodiment, the system management unit selects one of multiple power-performance states (P-states) when providing operating parameters for the memory.

The cross-over region 630 is used for determining whether to enable or disable boosting of word line voltage levels in the memory. The cross-over region 630 is based on a currently used word line boost value. In some embodiments, multiple available word line boost values are supported, each with an associated cross-over region. The cross-over region 630 in FIG. 6 is the range of operational voltages between the upper limit indicated as "V2" 620 and the lower limit indicated as "V1" 625. The upper limit V2 620 is a maximum operating voltage capable of being used by the memory while still enabling the boosting of the word line voltage levels in the memory. The boosting of the word line voltage levels in the memory is disabled for operational voltages above the upper limit V2 620 so as to prevent the memory word line voltage levels from exceeding the maximum rated operating voltage Vmax 610 of the memory. As the word line boost value increases, the associated cross-over region decreases as the upper limit V2 620 decreases to prevent the memory word line voltage levels from exceeding the maximum rated operating voltage Vmax 610 of the memory. Additionally, the lower limit V1 625 decreases but at a lower rate than the upper limit V2 620 decreases.

The lower limit V1 625 is a minimum operating voltage capable of being used by the memory while still disabling the boosting of the word line voltage levels in the memory. In various embodiments, the boosting of the word line voltage levels in the memory is enabled for operational voltages below the lower limit V1 625 so as to prevent the memory word line voltage levels from falling below the minimum rated operating voltage Vmin 615 of the memory. As the word line boost value decreases, the associated cross-over region increases as the upper limit V2 620 increases as it becomes less likely to cause the memory word line voltage levels from exceeding the maximum rated operating voltage Vmax 610 of the memory.

In one embodiment, when the memory uses an initial operational voltage below V1 625 of the cross-over region 630, such as Vmin 615, and the target operational voltage is determined to be above V2 620 of the cross-over region 630, such as Vmax 610, the intermediate operational voltage 640 is selected as a next operational voltage to use. The intermediate operational voltage 640 is an operational voltage within the cross-over region 630. In some embodiments, the intermediate operational voltage 640 is an operational voltage of a P-state within the cross-over region 630. In some embodiments, the cross-over region 630 has multiple P-states within it and the actual P-state selected is based on design choice.

When the memory transitions to using the intermediate operational voltage 640, a determination is made as to whether to enable or disable the boosting of the word line voltage levels. Here, the memory operational voltage is increasing and traversing across the cross-over region 630. Therefore, the boosting of the word line voltage levels transitions from being enabled to being disabled. Afterward, the memory transitions to using the target operational voltage Vmax 610.

In one embodiment, when the memory uses an initial operational voltage above V2 620 of the cross-over region 630, such as Vmax 610, and the target operational voltage is determined to be below V1 625 of the cross-over region 630, such as Vmin 615, the intermediate operational voltage 645 is selected as a next operational voltage to use. Similar to the intermediate operational voltage 640, the intermediate operational voltage 645 is an operational voltage within the cross-over region 630. In some embodiments, the intermediate operational voltage 645 is an operational voltage of a P-state within the cross-over region 630. In some embodiments, the cross-over region 630 has multiple P-states within it and the actual P-state selected is based on design choice. In one embodiment, the intermediate operational voltage 640 is the same as intermediate operational voltage 645. In other embodiments, the two intermediate operational voltages 640 and 645 are different values.

When the memory transitions to using the intermediate operational voltage 645, a determination is made as to whether to enable or disable the boosting of the word line voltage levels. Here, the memory operational voltage is decreasing and traversing across the cross-over region 630. Therefore, the boosting of the word line voltage levels transitions from being disabled to being enabled. Afterward, the memory transitions to using the target operational voltage Vmin 615.

In some embodiments, a comparator is used to determine when the memory operational voltage either rises above the upper limit V2 620 or falls below the lower limit V1 625. Any of a variety of comparators is used. However, in such embodiments, the offset voltage within the comparator is accounted for in the measurement. In some embodiments, multiple comparators are used in order to obtain a higher reliable measurement as voltage droop and other supply voltage variations occur across the semiconductor die. In one embodiment, the one or more comparators are used in combination with the step of using the intermediate operational voltage (640 or 645) within the cross-over region. In other embodiments, the one or more comparators are used alone and not in combination with the step of using the intermediate operational voltage (640 or 645) within the cross-over region.

Figure 7:
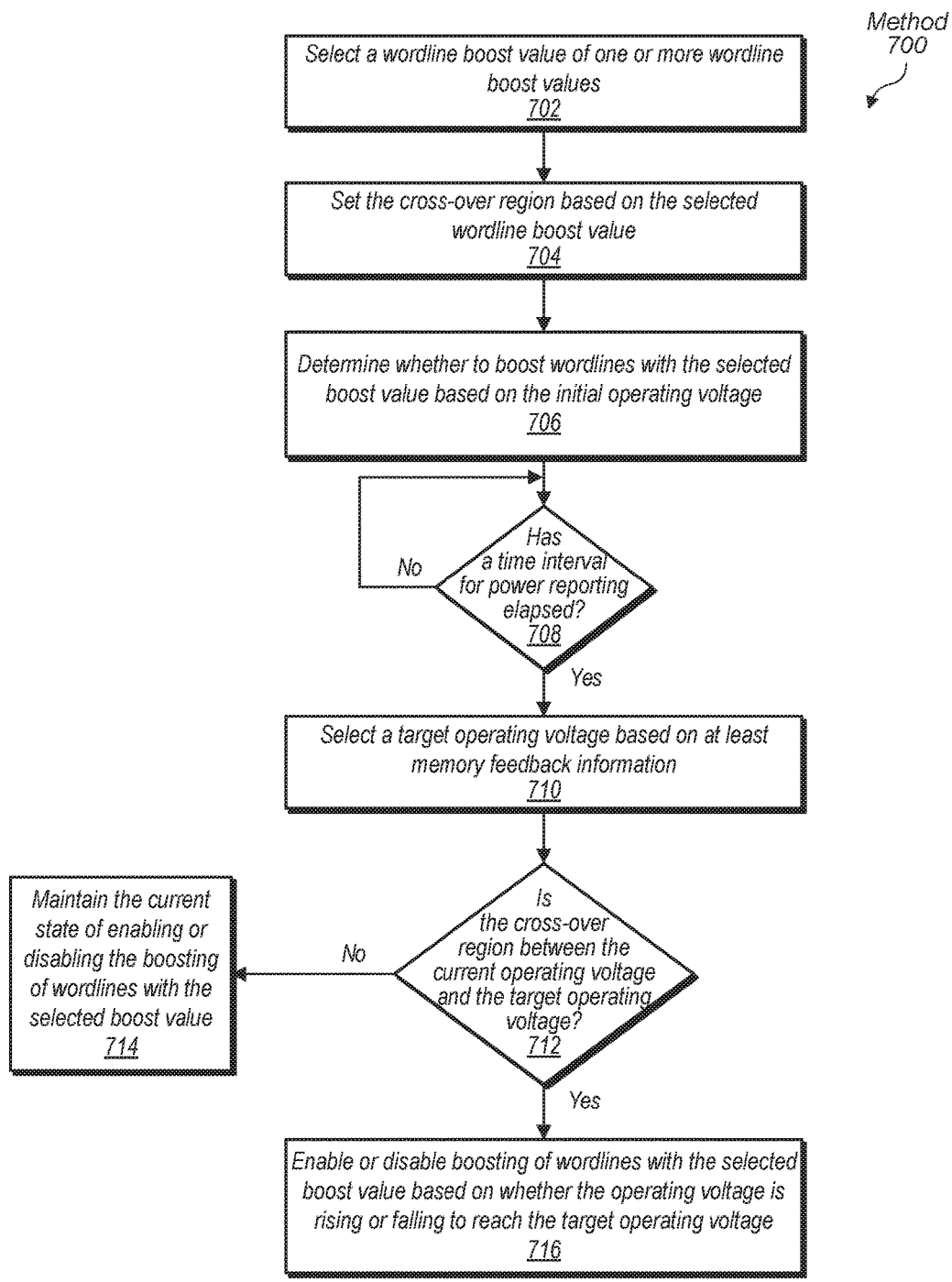
FIG. 7 is a generalized diagram of one embodiment of a method for updating the memory operational voltage.

Referring now to FIG. 7, one embodiment of a method 700 for updating the memory operational voltage is shown. For purposes of discussion, the steps in this embodiment (as well as the method shown in FIG. 8) are shown in sequential order. However, in other embodiments some steps occur in a different order than shown, some steps are performed concurrently, some steps are combined with other steps, and some steps are absent.

To process instructions of one or more algorithms, a processing unit fetches instructions and data, decodes instructions, and executes instructions and stores results. The processing unit generates memory access requests for retrieving instructions and operand data and for storing result data. The memory access requests are sent to a memory. A word line boost value of one or more available word line boost values is selected for the memory (block 702). A cross-over region is selected based on the selected word line boost value (block 704). As described earlier, the cross-over region is a range of operating voltages for the memory used for determining whether to enable or disable boosting of word line voltage levels in the memory. The range is a subset of operating voltages below a maximum rated operating voltage of the memory and above a minimum rated operating voltage of the memory. The range includes an upper limit and a lower limit.

Determining whether to boost word lines with the selected boost value is done based on the initial operating voltage of the memory (block 706). In some embodiments, when the initial operating voltage of the memory is above the upper limit of the cross-over region, boosting of word line voltage levels is disabled to protect the transistors. When the initial operating voltage of the memory is below the lower limit of the cross-over region, boosting of word line voltage levels is enabled to strengthen the pass gates used during write operations.

In some embodiments, each of the processing unit and the memory receive requested time interval(s) for power usage reporting from an external agent, such as the operating system or another chip or computation unit. Alternatively, the time interval for reporting is stored in configuration and status registers, in BIOS, or in firmware. If the time interval for power reporting elapsed ("yes" branch of the conditional block 708), then a target operating voltage is selected based on at least feedback information from the memory (block 710). In various embodiments, another computational unit, such as the system management unit described earlier, determines the target operational voltage.

If the cross-over region is not between the current (initial) operating voltage and the selected target operating voltage ("no" branch of the conditional block 712), then the current state of enabling or disabling the boosting of word lines with the selected boost value is maintained (block 714). For example, if each of the current operational voltage and the selected target operational voltage is above the upper limit of the cross-over region, then boosting of word line voltage levels remains disabled to protect the transistors. Similarly, if each of the current operational voltage and the selected target operational voltage is below the lower limit of the cross-over region, then boosting of word line voltage levels remains enabled to strengthen the pass gates used during write operations.

If the selected target operational voltage for the memory is within the cross-over region, then determining whether to boost word line voltage levels in the memory is based at least in part on the current operating voltage. The current state of enabling or disabling the boosting of the word line voltage levels is still maintained. For example, when the current operational voltage is above the upper limit of the cross-over region, the boosting of word line voltage levels remains disabled for the target operational voltage within the cross-over region to protect the transistors. Similarly, when the current operational voltage is below the lower limit of the cross-over region, the boosting of word line voltage levels remains enabled for the target operational voltage within the cross-over region to strengthen the pass gates used during write operations.

If the cross-over region is between the current (initial) operating voltage and the selected target operating voltage ("yes" branch of the conditional block 712), then determining whether to enable or disable the boosting of word lines with the selected boost value is based on whether the operating voltage is falling or rising to reach the target operating voltage (block 716). Further details of these steps is provided in the below description.

Figure 8:
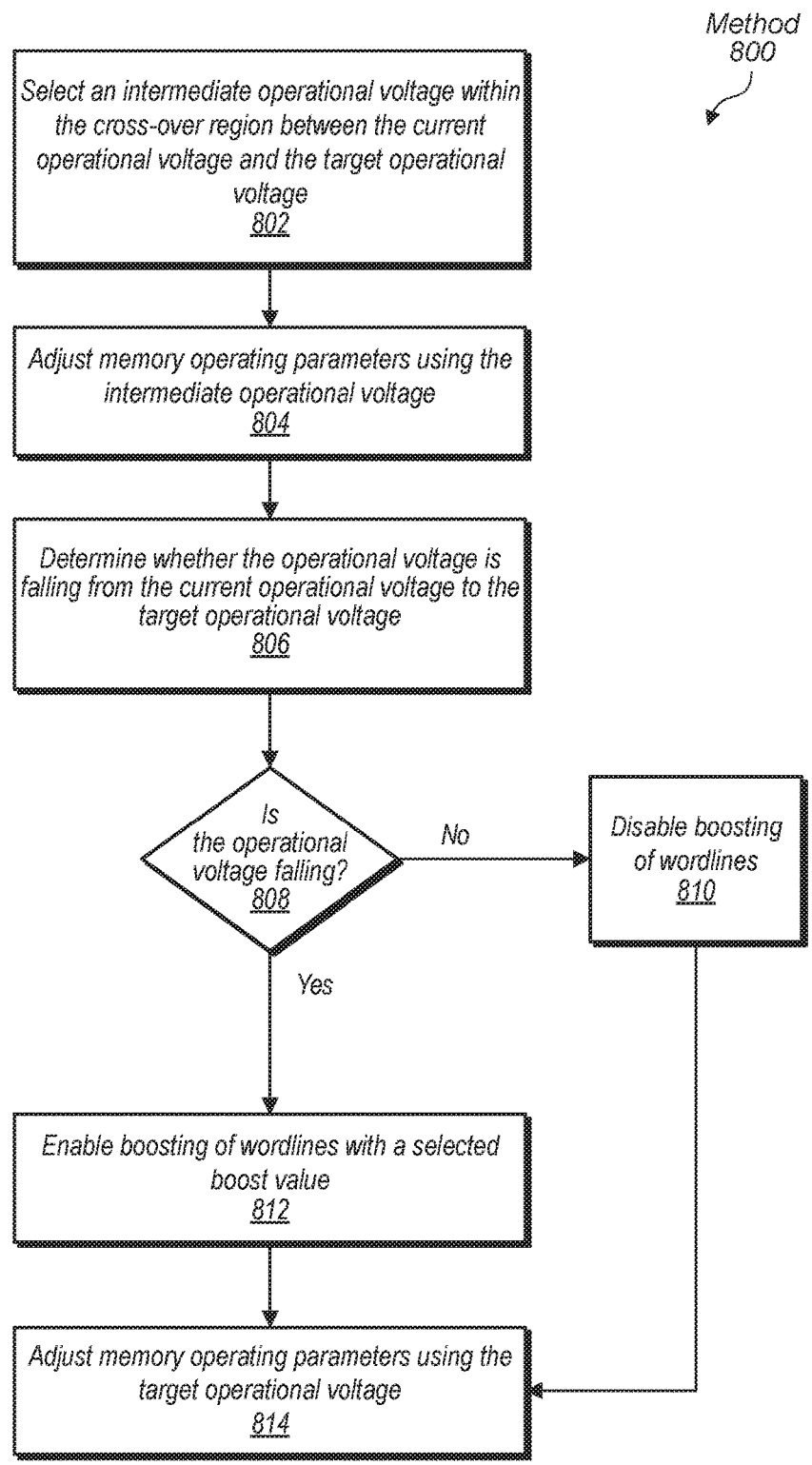
FIG. 8 is a generalized diagram of one embodiment of a method for updating the memory operational voltage when the update transitions over a particular voltage range.

Turning now to FIG. 8, one embodiment of a method 800 for updating the memory operational voltage when the update transitions over a particular voltage range is shown. An intermediate operating voltage within the cross-over region between the current operating voltage and the target operating voltage is selected (block 802). The memory operating parameters are adjusted using the intermediate operational voltage (block 804). Therefore, the memory is not yet operating with the selected target operational voltage. It is determined whether the operational voltage is falling from the current operational voltage to the target operational voltage (block 806). For example, in one embodiment, the current operational voltage is compared to the target operational voltage, and if the current operational voltage is greater, then the memory operational voltage is falling. Otherwise, the memory operational voltage is rising.

If the memory operational voltage is not falling ("no" branch of the conditional block 808), then the boosting of the word line voltage levels is disabled (block 810). Since (i) the cross-over region is between the current operational voltage and the selected target operational voltage and (ii) the current operational voltage is less than the selected target operational voltage (memory operational voltage is rising in this case), the selected target operational voltage is above the upper limit of the cross-over region. Thus, the boosting of the word line voltage levels is disabled to prevent exceeding the maximum rated operating voltage.

If the memory operational voltage is falling ("yes" branch of the conditional block 808), then the boosting of the word line voltage levels is enabled (block 812). Since (i) the cross-over region is between the current operational voltage and the selected target operational voltage and (ii) the current operational voltage is greater than the selected target operational voltage (memory operational voltage is falling in this case), the selected target operational voltage is below the lower limit of the cross-over region. Thus, the boosting of the word line voltage levels is enabled to strengthen the pass gates used during write operations. Afterward, the memory operating parameters are adjusted using the selected target operational voltage (block 814). Thus, the adjustment to the selected target operational voltage is a two-phase process using the intermediate operational voltage within the cross-over region.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system comprising:
   a memory configured to operate with each of a plurality of operational voltages, each of said operational voltages corresponding to a different power-performance state (P-state);
   a processing unit configured to generate access requests for the memory; and
   a system management unit configured to:
      set a cross-over region comprising a range of operating voltages for the memory;
      determine a target P-state different than a current P-state based on feedback information received from one or more of the processing unit and the memory; and
      enable boosting of word line voltage levels in the memory as a transitioning operational voltage of the memory transitions from the current operational voltage to the target operational voltage responsive to determining:
         the current operational voltage is greater than the target operational voltage; and
         the transitioning operational voltage of the memory is less than a lower limit of the range.

2. The computing system as recited in claim 1, wherein the system management unit is further configured to:
   disable boosting of word line voltage levels in the memory as the operational voltage of the memory transitions from the current operational voltage to the target operational voltage responsive to determining:
      the current operational voltage is less than the target operational voltage; and
      the transitioning operational voltage of the memory is greater than an upper limit of the range.

3. The computing system as recited in claim 2, wherein in response to detecting the target operational voltage is within the cross-over region, boosting of the word line is:
   available while a transitioning operating voltage of the word line is below an upper limit of the range; and
   unavailable while the transitioning operating voltage of the word line is above an upper limit of the range.

4. The computing system as recited in claim 3, wherein while word line boost is disabled and the transitioning operating voltage of the word line is falling, word line boosting is enabled prior to the transitioning operating voltage of the word line falling below a lower limit of the range.

5. The computing system as recited in claim 3, wherein the cross-over region is based on a word line boost value used for boosting the word line voltage levels in the memory.

6. The computing system as recited in claim 5, wherein the system management unit is further configured to select the word line boost value from a plurality of word line boost values, each with an associated cross-over region.

7. The computing system as recited in claim 1, wherein the system management unit is further configured to:
   in response to determining the cross-over region is between the current operating voltage corresponding to the current P-state and the target operational voltage, update the operating parameters to include an intermediate operating voltage for the memory within the cross-over region.

8. The computing system as recited in claim 7, wherein the system management unit is further configured to enable boosting of word line voltage levels in the memory responsive to determining the current operating voltage corresponding to the current P-state is greater than the target operational voltage.

9. The computing system as recited in claim 7, wherein the system management unit is further configured to disable boosting of word line voltage levels in the memory responsive to determining the current operating voltage corresponding to the current P-state is less than the target operational voltage.

10. A method comprising:
    operating a memory with each of a plurality of operational voltages, each of said operational voltages corresponding to a different power-performance state (P-state);
    setting a cross-over region comprising a range of operating voltages for the memory;
    determining a target P-state different than a current P-state based on feedback information received from one or more of the memory and a processing unit generating access requests for the memory; and
    enabling boosting of word line voltage levels in the memory as a transitioning operational voltage of the memory transitions from the current operational voltage to the target operational voltage responsive to determining:
       the current operational voltage is greater than the target operational voltage; and
       the transitioning operational voltage of the memory is less than a lower limit of the range.

11. The method as recited in claim 10, further comprising:
    disabling boosting of word line voltage levels in the memory as the operational voltage of the memory transitions from the current operational voltage to the target operational voltage responsive to determining:
       the current operational voltage is less than the target operational voltage; and
       the transitioning operational voltage of the memory is greater than an upper limit of the range.

12. The method as recited in claim 11, wherein in response to detecting the target operational voltage is within the cross-over region, boosting of the word line is:
    available while a transitioning operating voltage of the word line is below an upper limit of the range; and
    unavailable while the transitioning operating voltage of the word line is above an upper limit of the range.

13. The method as recited in claim 12, wherein while word line boost is disabled and the transitioning operating voltage of the word line is falling, the method further comprises enabling word line boosting prior to the transitioning operating voltage of the word line falling below a lower limit of the range.

14. he method as recited in claim 10, further comprising:
in response to determining the cross-over region is between the current operating voltage corresponding to the current P-state and the target operational voltage, updating the operating parameters to include an intermediate operating voltage for the memory within the cross-over region.

15. The method as recited in claim 14, further comprising enabling boosting of word line voltage levels in the memory responsive to determining the current operating voltage corresponding to the current P-state is greater than the target operational voltage.

16. The method as recited in claim 14, further comprising disabling boosting of word line voltage levels in the memory responsive to determining the current operating voltage corresponding to the current P-state is less than the target operational voltage.

17. A system management unit comprising:
an interface to a memory operating with each of a plurality of operational voltages, each of said operational voltages corresponding to a different power-performance state (P-state) and a processing unit generating access requests for the memory; and
control logic configured to:
set a cross-over region comprising a range of operating voltages for the memory;
determine a target P-state different than a current P-state based on feedback information received from one or more of the memory and the processing unit; and
enable boosting of word line voltage levels in the memory as a transitioning operational voltage of the memory transitions from the current operational voltage to the target operational voltage responsive to determining:
the current operational voltage is greater than the target operational voltage; and
the transitioning operational voltage of the memory is less than a lower limit of the range.

18. The system management unit as recited in claim 17, wherein the control logic is further configured to:
disable boosting of word line voltage levels in the memory as the operational voltage of the memory transitions from the current operational voltage to the target operational voltage responsive to determining:
the current operational voltage is less than the target operational voltage; and
the transitioning operational voltage of the memory is greater than an upper limit of the range.

19. The system management unit as recited in claim 18, wherein the cross-over region is based on a word line boost value used for boosting the word line voltage levels in the memory.

20. The system management unit as recited in claim 17, wherein the control logic is further configured to:
in response to determining the cross-over region is between the current operating voltage corresponding to the current P-state and the target operational voltage, update the operating parameters to include an intermediate operating voltage for the memory within the cross-over region.

* * * * *

UNITED STATES PATENT AND TRADEMARK OFFICE
CERTIFICATE OF CORRECTION

Page 1 of 1

PATENT NO. : 10,366,734 B2
APPLICATION NO. : 15/424418
DATED : July 30, 2019
INVENTOR(S) : Alexander W. Schaefer It is certified that error appears in the above-identified patent and that said Letters Patent is hereby corrected as shown below:

In the Claims

Column 17, Claim 14, Line 7, please delete "he method as" and substitute -- The method as --.

Signed and Sealed this
First Day of October, 2019

Andrei Iancu
*Director of the United States Patent and Trademark Office*